(12) United States Patent
Mori

(10) Patent No.: US 6,963,102 B2
(45) Date of Patent: *Nov. 8, 2005

(54) NON-VOLATILE SEMICONDUCTOR MEMORY HAVING A DECREASED GATE LENGTH

(75) Inventor: Seiichi Mori, Tokyo-To (JP)

(73) Assignee: Kabushiki Karsha Toshiba, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/451,619

(22) Filed: Nov. 30, 1999

(65) Prior Publication Data

US 2003/0001195 A1 Jan. 2, 2003

(30) Foreign Application Priority Data

Nov. 30, 1998 (JP) .......................................... 10-340387

(51) Int. Cl.⁷ ...................... H01L 29/788; H01L 29/792
(52) U.S. Cl. ...................... 257/315; 257/324; 438/288
(58) Field of Search ............................... 257/315, 324; 438/288

(56) References Cited

U.S. PATENT DOCUMENTS

| | | | | |
|---|---|---|---|---|
| 5,345,104 A | * | 9/1994 | Prall et al. ................... | 257/607 |
| 5,631,179 A | * | 5/1997 | Sung et al. .................. | 438/264 |
| 5,640,345 A | * | 6/1997 | Okuda et al. ................ | 365/184 |
| 5,904,518 A | * | 5/1999 | Komori et al. .............. | 438/201 |
| 6,130,452 A | * | 10/2000 | Lu et al. ...................... | 257/315 |

FOREIGN PATENT DOCUMENTS

| | | |
|---|---|---|
| JP | 05-343701 | 12/1993 |
| JP | 06-326322 | 11/1994 |
| JP | 07-297299 | 11/1995 |
| JP | 09-260513 | 10/1997 |
| JP | 10-065151 | 3/1998 |

OTHER PUBLICATIONS

Cappelletti, P., et al., Flash Memories, 1999, Kluwer Academic Pubs., pp. 68–69.*

"An EEPROM Cell with Asymetrical Sidewall to Minimize Drain Couplings", Apr. 1993, IBM technical Disclosure Bulletin, vol. 36, No. 04, pp. 45–47.*

Kume, H., et al., "A Flash–Erase EEPROM Cell with an Asymetric Source and Drain Structure", 1987, IEDM 87, pp. 560–563.*

* cited by examiner

*Primary Examiner*—Howard Weiss
(74) *Attorney, Agent, or Firm*—Hogan & Hartson, LLP

(57) ABSTRACT

An enhanced non-volatile semiconductor memory has a source region and a drain region provided in a semiconductor substrate, an electric charge accumulating portion provided on a channel region between the source and drain regions and a control gate provided on said channel region and at least said source region is provided by introducing an impurity in self-alignment with a side wall provided on a side surface of said control gate, characterized in that an overlap of said drain region with said electric charge accumulating portion is set larger than an overlap of said source region with said electric charge accumulating portion, and an impurity dose quantity of said source region is larger than an impurity dose quantity of said drain region. The drain region may be formed by self alignment manner using a first side wall and the source region may be formed by self alignment manner using a second side wall formed on the first side wall.

17 Claims, 9 Drawing Sheets

NON-VOLATILE SEMICONDUCTOR MEMORY HAVING A DECREASED GATE LENGTH

BACKGROUND OF THE INVENTION

1. Field of the Invention

The present invention relates generally to an electrically erasable non-volatile semiconductor memory, and more particularly to a memory cell structure useful for a flash EEPROM of a NOR type etc., in which a writing operation is executed by injecting hot electrons.

2. Description of the Background Art

A memory cell of an EEPROM (Electrically Erasable Programable Read Only Memory) normally involves the use of an FETMOS structure in which a floating gate and a control gate are stacked via an insulating film on a semiconductor substrate.

Among a variety of EEPROMs, normally a hot electron injection is utilized in a NOR type flash memory cell. That is, in writing mode, the memory cell is set in on-state in which a large channel current flows. In this state, Hot electrons are thereby generated in a pinch-off region in the vicinity of a drain, and are injected into the floating gate. An erasing operation is carried out, for example, by releasing the electrons accumulated in the floating gate towards a source by use of a Fowler-Nordheim tunnel current mechanism.

In the thus structured hot electron injection type memory cell, it is required that a diffusion distance, an impurity concentration and an overlap with the floating gate are optimally set with respect to the source and drain regions in order to optimize write and erasure characteristics. For example, in the case of the memory cell having a structure to perform an erasure by releasing the electrons accumulated in the floating gate towards the source, a large overlap with the floating gate is needed with respect to the source region. Furthermore, since a large channel current flows during the writing operation, it is required that a source resistance be sufficiently low. It is therefore desired that the source region be deeper and higher in concentration than the drain region. Moreover, when the electrons are trapped in a gate insulating film in the vicinity of the drain with a repetition of the writing operations, an offset might occur in the drain side, thereby inducing decreases in a write efficiency to the memory cell and in current drivability as well. In order to prevent these decreases from occurring, an overlap with the floating gate with respect to the drain region, which is not so much as the source region, is required.

On the other hand, there was proposed a structure for increasing the overlap with the floating gate in the drain region with respect to a hot electron injection type non-volatile memory cell (refer to, e.g., Japanese Patent Application Laid-Open Publication Nos.5-343701 (1993) and 6-252414 (1994)).

Furthermore, there exists a non-volatile memory which is not classified as the hot electron injection type, wherein the electrons are injected and released by the tunnel current between the drain region and the floating gate. In the case of this type of memory cell, it is effective that the overlap of the drain region with the floating gate takes an asymmetric structure set as large as the source region in the case of releasing the electrons towards the source (refer to, e.g., Japanese Patent Application Laid-Open Publication No.5-36990(1993)). Still further, there is, though not a method of utilizing the hot electrons generated by the channel current in an on-state bias, a proposal for increasing similarly the overlap of the drain region with the floating gate with respect to the memory cell utilizing the hot electrons generated by avalanche (refer to Japanese Patent Application Laid-Open Publication No.5-55599).

As explained above, in the conventional non-volatile memory cell utilizing the electron implantation from the drain region as typified by the hot electron injection, there are required the respective overlaps of the source and drain regions with the floating gate. Moreover, it is also proposed from a various points of view that a geometry between the floating gate and the source and drain regions takes the asymmetric structure. The progress of the technology of down scaling the semiconductor devices has been remarkable over the recent years, however, if making an attempt of attaining a high-integration EEPROM by use of the down scaling technology, there might arise a situation in which an effective channel length can not be ensured in the case of increasing the overlaps of the source and drain regions with the floating gate. Furthermore, when trying to keeping the effective channel length Leff to some extent, a gate length L elongates corresponding to a proportion of the overlaps of the source and drain regions with the floating gate, and it is therefore difficult to reduce a size of the memory cell.

SUMMARY OF THE INVENTION

It is therefore a primary object of the present invention to provide a non-volatile semiconductor memory having a memory cell structure which are capable of decreasing a gate length to the greatest possible degree while ensuring an effective channel length required.

It is a secondary object of the present invention to provide a manufacturing method for manufacturing such non-volatile semiconductor memory.

According to the fist aspect of the present invention, there is provided a non-volatile semiconductor memory comprising:

a semiconductor substrate;

a source region provided in said semiconductor substrate;

a drain region provided in said semiconductor substrate, said source and drain regions being spaced away from each other;

an electric charge accumulating portion provided on a channel region between said source and drain regions; and a control gate provided on said channel region, a writing operation being executed in such a way that hot electrons are generated in the vicinity of said drain region and injected into said electric charge accumulating portion, wherein at least said source region is provided by introducing an impurity in self-alignment with a side wall provided on a side surface of said control gate, and an overlap of said drain region with said electric charge accumulating portion is set larger than an overlap of said source region with said electric charge accumulating portion.

It is preferable that an impurity dose quantity of said source region is larger than an impurity dose quantity of said drain region.

The memory cell according to the present invention, the edge of the source region on the side of the channel region is defined by the side wall insulating layer of the control gate, and the edge of the dram region on the aide of the channel region is defined by the edge of the control gate or by the outer side of the thin side wall insulating layer or the side surface of the control gate. Accordingly, there is obtained an asymmetric memory cell structure, in which the overlap of the source region with the electric charge accumulating portion (typified by the floating gate) is act to the minimum necessary enough to cause no offset, and the overlap of the drain region with the floating gate is set larger than that of the source region. It is therefore possible to reduce a gate length while ensuring an effective channel length required.

Herein, if the overlap of the source region with the floating gate is decreased, an erasing efficiency declines in the conventional erasing operation wherein the electrons are released to the source region. With respect to this point, there might be no problem if there is utilized such an erasing operation of releasing the electrons in the floating gate over an entire surface of the channel region. Further, in a writing operation involving a flow-out of a large channel current, it is much importance for an implantation efficiency that a resistance of the source region is well small. Hence, according to the present invention, the impurity dose quantity of the source region is set preferably larger than that of the drain region, and the junction depth of the source region is set larger than that of the drain region. A small source resistance is thereby actualized, and a high programming efficiency can be obtained.

Further, in the case of the memory cell wherein the electric charge accumulating layer receiving the implantation of the hot electrons is defined as the trap level within the insulating layer, the erasing operation may involve pulling the electrons held by the trap level to the drain region by tunneling, or more preferably may involve neutralization of the electrons held by the trap level by injecting holes generated in the vicinity of the drain region.

According to the second aspect of the present invention, there is provided a method of manufacturing a non-volatile semiconductor memory, comprising:

a step of providing a control gate trough an electric charge accumulating portion on a semiconductor substrate;

a step of providing a drain region by introducing an impurity outwardly of one edge of said control gate on said semiconductor substrate in self-alignment with the edge thereof;

a step of providing a side wall insulating layer on a side surface of said control gate; and a step of providing a source region by introducing the impurity outwardly of said side wall insulating layer on said semiconductor substrate in self-alignment with said side wall insulating layer.

Before introducing the impurity to obtain the drain region, there are cases in which a step of providing a an oxide film (post oxidation) on the surface of the substrate is applied.

According to the third aspect of the present invention, there is provided a method of manufacturing a non-volatile semiconductor memory, comprising:

a step of providing a floating gate material layer through a channel insulating layer on a semiconductor substrate;

a step of providing a control gate material layer through an inter-layer insulating layer on said floating gate material layer;

a step of providing a control gate and a floating gate by sequentially patterning said control gate material layer and said floating gate material layer;

a step of providing a drain region by introducing an impurity outwardly of one edge of said control gate on said semiconductor substrate in self-alignment with the edge thereof;

a step of providing a side wall insulating layer on side surfaces of said control gate and of said floating gate; and a step of providing a source region by introducing the impurity outwardly of said side wall insulating layer on said semiconductor substrate in self-alignment with said side wall insulating layer.

According to the fourth aspect of the present invention, there is provided a method of manufacturing a non-volatile semiconductor memory, comprising:

a step of providing a control gate trough an electric charge accumulating portion on a semiconductor substrate;

a step of providing a first side wall insulating layer on a side surface of said control gate;

a step of providing a drain region by introducing an impurity outwardly of said first side wall insulating layer on said semiconductor substrate in self-alignment with said first side wall insulating layer;

a step of providing a second side wall insulating layer on a side surface of said first side wall insulating layer; and a step of providing a source region by introducing the impurity outwardly of said second side wall insulating layer on said semiconductor substrate in self-alignment with said second side wall insulating layer.

According to the fifth aspect of the present invention, there is provided a method of manufacturing a non-volatile semiconductor memory, comprising:

a step of providing a floating gate material layer through a channel insulating layer on a semiconductor substrate;

a step of providing a control gate material layer through an inter-layer insulating layer on said floating gate material layer;

a step of providing a control gate and a floating gate by sequentially patterning said control gate material layer and said floating gate material layer;

a step of providing a first side wall insulating layer on side surfaces of said control gate and of said floating gate;

a step of providing a drain region by introducing an impurity outwardly of said first side wall insulating layer on said semiconductor substrate in self-alignment with said first side wall insulating layer;

a step of providing a second side wall insulating layer on a side surface of said first side wall insulating layer; and a step of providing a source region by introducing the impurity outwardly of said second side wall insulating layer on said semiconductor substrate in self-alignment with said second side wall insulating layer.

BRIEF DESCRIPTION OF THE DRAWINGS

In the accompanying drawings.

DESCRIPTION OF THE PREFERRED EMBODIMENTS

Embodiments of the present invention will hereinafter be described with reference to the accompanying drawings.

Figure 1:
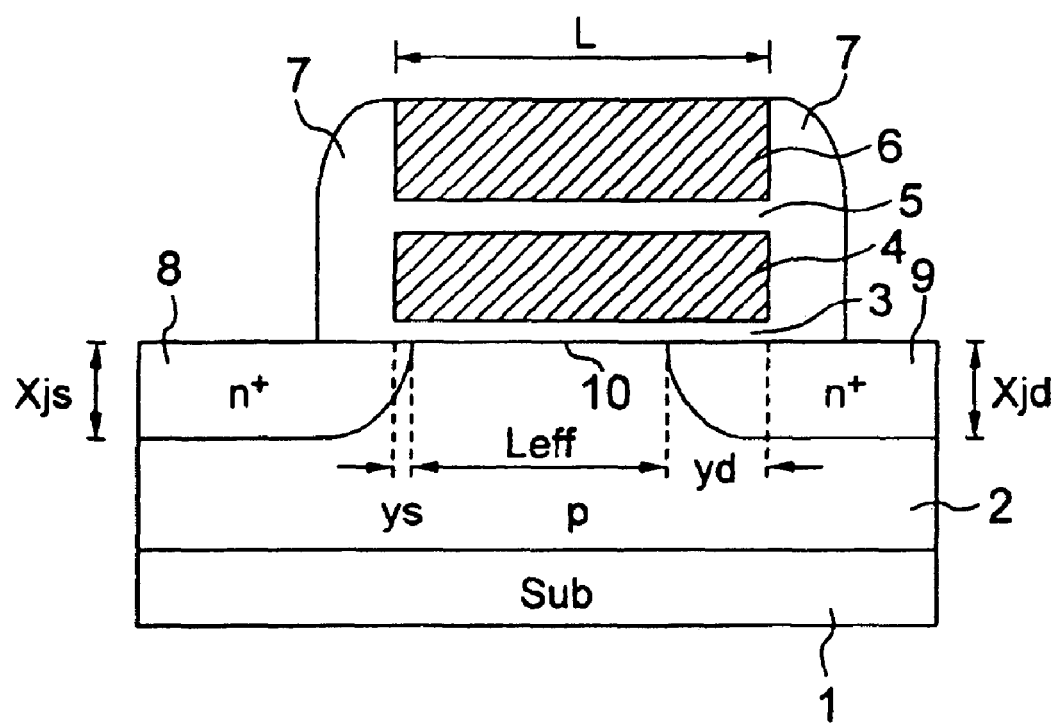
FIG. 1 is a sectional view showing a memory cell structure according to the first embodiment of the present invention.

FIG. 1 shows a memory cell structure in the first embodiment of the present invention. A p-type well 2 is provided in a memory cell region on a silicon substrate 1. The p-type well 2 is formed with a silicon oxide film 3 by thermal oxidation, serving as a tunnel insulating film. A floating gate 4 is provided on the silicon oxide film 3. A control gate 6 is further provided on the floating gate 4 through an inter-layer insulating layer 5. The control gate 6 and the floating gate 4 are patterned in the same size in a gate-lengthwise direction.

An n$^+$ type source region 8 and a drain region 9 are formed in separate ion implantation processes. To be specific, the drain region 9 is formed by the ion implantation in self-alignment manner with a right edge of the control gate 6. A side wall insulting layer 7 is provided on side surfaces of the floating gate 4 and of the control gate 6, and the source region 8 is formed by the ion implantation in self-alignment manner with a left side surface of the side wall insulating layer 7.

The source and drain regions 8, 9 are overlapped with the floating gate 4 due to an impurity rediffusion by a thermal treatment after implanting the ions, and take an asymmetric structure corresponding to an existence or non-existence of the side wall insulating layer 7 during respective ion implantation. That is, an edge of the source region 8 on the side of the channel region 10 is determined by an edge of the side wall insulating layer 7, and the overlap of the source region 8 with the floating gate 4 is designated by "ys". An edge of the drain region on the side of the channel region 10 is determined by an edge of the control gate 6, and the overlap of the drain region 9 with the floating gate is designated by "yd" (>ys).

As shown in FIG. 1, the effective channel length Leff is given by:

$$\text{Leff} = L - (ys + yd)$$

where L is the gate length. The overlap "yd" on the side of the source region 8 is set to a minimum value within a range of causing no offset.

The doses for the source and drain regions 8, 9 are different from each other. Namely, the dose quantity of the source region 8 is set larger than that of the drain region 9. As a result, diffusion depth (a junction depth) "xjs" of the source region 8 has the following relationship with a diffusion depth (a junction depth) "xjd" of the drain region 9.

$$xjs > xjd$$

Figure 2A:
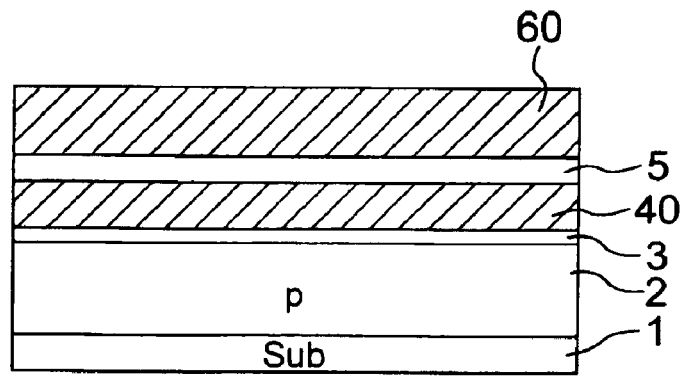
FIGS. 2A–2F are sectional views showing a process for obtaining the memory cell structure shown in FIG. 1.

A process of manufacturing the memory cell structure shown in FIG. 1 will be explained with reference to FIGS. 2A–2F. FIG. 2A shows a step of stacking a gate electrode area of the same memory cell, FIG. 2B shows a step of patterning the gate electrode area of the same memory cell, FIG. 2C shows a step of implanting ions into a drain region of the same memory cell, FIG. 2D shows a step of providing a side wall insulating layer of the same memory cell, FIG. 2E shows a step of implanting ions into a source region of the same memory cell, and FIG. 2F shows a step of a diffusion of an impurity of the same memory cell.

As shown in FIG. 2A, a tunnel oxide layer 3 is provided by thermal oxidation on the substrate 1 formed with the p-type well 2. A first layer polycrystalline silicon layer 40 defined as a floating gate material layer, an inter-layer insulating layer 5 and a second layer polycrystalline silicon layer 60 classified as a control gate material layer, are sequentially stacked on the tunnel oxide layer 3.

Figure 2B:
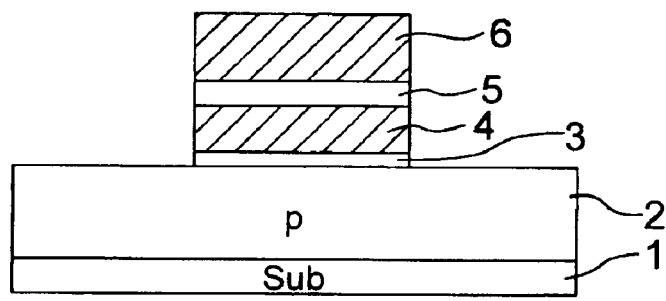
Figure 2C:
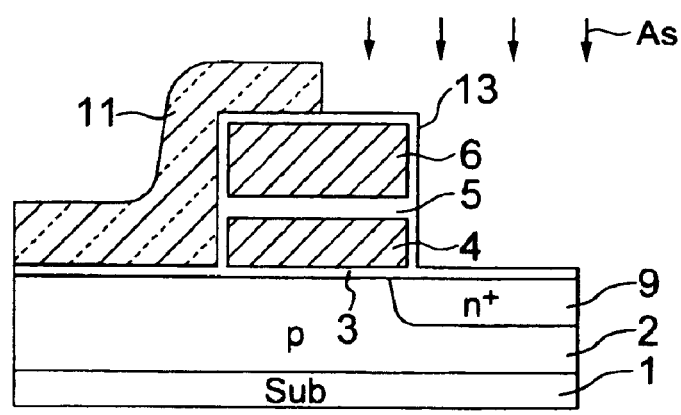
Figure 2D:
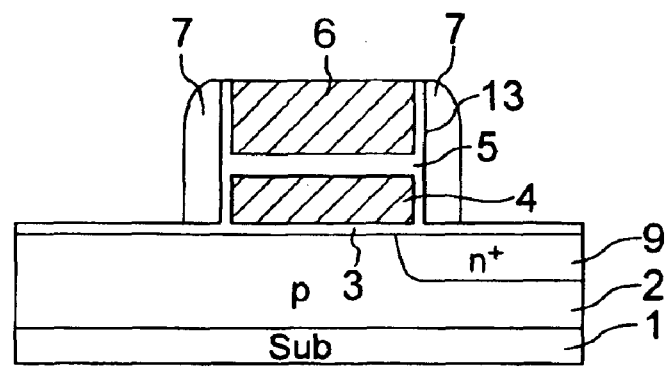
Figure 2E:
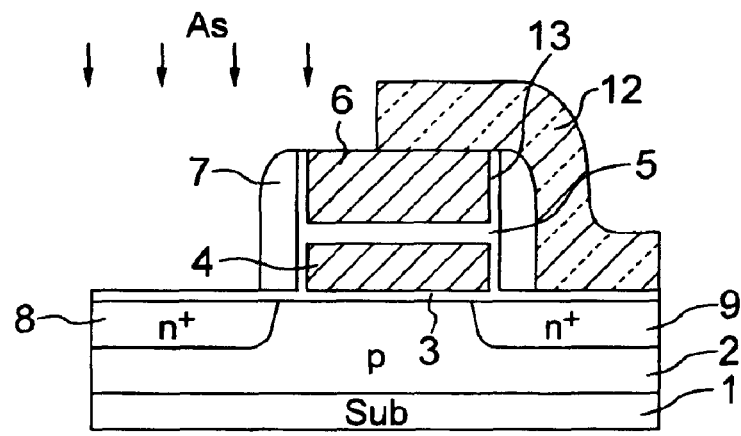
Figure 2F:
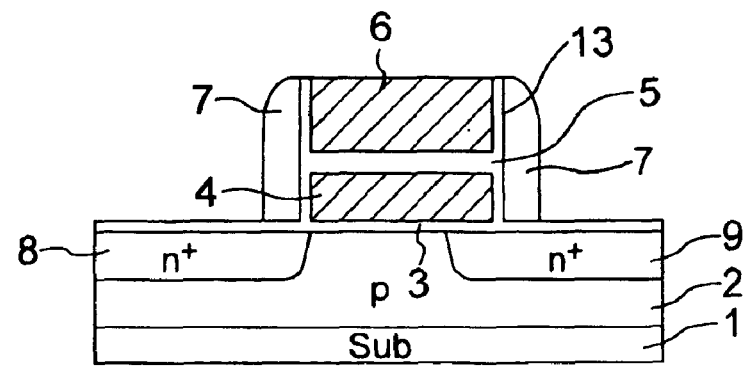

Subsequently, the polycrystalline silicon layer 60, the inter-layer insulating layer 5, the polycrystalline silicon layer 40 are sequentially etched by known lithography and RIE processes, thereby pattern-forming the control gate 6 and the floating gate 4 with the same width as shown in FIG. 2B. When the control gates 6 are disposed as word lines for a plurality of memory cells, however, the floating gate material layer 40 is previously separated before stacking the control gate material layer 60 in a direction orthogonal to what is shown in the Figure.

Thereafter, an oxide layer 13 is provided on exposed surfaces of the control gate 6 and of floating gate 4 and on the surface of the substrate 1 by effecting the thermal oxidation. As shown In FIG. 2C, a resist pattern 11 covering an area on the source region side is thereafter provided by the lithography process. Then, the ion, i.e., arsenic is implanted, thereby providing the n$^+$ type drain region 9 self-aligned with the control gate 6. At this stage, however, the impurity in the drain region 9 is not yet activated. The dose quantity of arsenic is set on the order of, e.g., $2 \times 10^{15}/\text{cm}^2$.

Subsequently, for example, a silicon oxide layer on the order of 70 nm is stacked by an LP-CVD method and then etched back by the RIE, whereby, as shown in FIG. 2D, the side wall insulating layer 7 having a thickness of 70 nm is provided on the side surfaces of the floating gate 4 and of the control gate 6.

Next, the lithography process is again executed, thereby providing a resist pattern 12 covering an area on the side of the drain region 9 as shown in FIG. 2E. Then, the ion, i.e., arsenic, is implanted, thereby providing the n$^+$ type source region 8 self-aligned with the side wall insulating layer 7. At that time the dose quantity of arsenic is set on the order of, e.g., $5 \times 10^{15}/\text{cm}^2$.

Finally, the impurities of the source and drain regions 8, 9 are re-diffused, and the thermal treatment for activating the impurities is performed. The source region 8 is thereby, as shown in FIG. 2F, slightly overlapped with the floating gate 4. By contrast, the drain region 9 comes to a state of being overlapped with the floating gate larger by a thickness of the side wall insulating layer 7 than the overlap of the region 8.

Specifically, supposing that there be executed such a thermal diffusion process that a crosswise diffusion length of arsenic is approximately 80 nm, the overlap "yd" of the drain region 9 with the floating gate 4 is given such as yd=80 nm or thereabout. The overlap "ys" of the source region 8 with the floating gate 4 is given by: ys=10 nm or thereabout. In fact, the diffusion length of the drain region 9 becomes larger by an amount of receiving a heat hysteresis in the process of forming the side wall insulating layer 7, however, this may be ignored.

Accordingly, in this embodiment, when manufacturing the memory cell of which the effective channel length Leff= 150 nm, the gate length needed is given such as $$L = 150 + 80 + 10 = 240 \text{ nm}$$

or thereabout. In the case of providing the 80 nm-overlaps of both of the source and drain regions with the floating gate, the necessary gate length is 310 nm, and hence the size of the memory cell can be effectively reduced in accordance with this embodiment.

In a writing mode to the memory cell in this embodiment, the source region 8 is set at a low potential (e.g., a grounding potential), and a large channel current is flowed by applying a positive high potential to the control gate 6 and the drain region 9. The hot electrons generated in the pinch-off region in the vicinity of the drain region 9 are thereby injected into the floating gate 4, resulting in a state where a threshold value is high. In an erasing mode, the control gate 6 is set at a lower potential (e.g., the grounding potential), and the positive high-potential is applied to the p-type well 2. The electrons in the floating gate 4 are thereby released over the entire surface of the channel region 10.

In accordance with this embodiment, the overlap of the drain region 9 with the floating gate 4 is ensured larger than the overlap of the source region 8 with the floating gate 4. As a result, a high electron implantation efficiency is obtained in the writing operation, and further the offset due to the trapping of the electrons at the drain edge can be prevented. Moreover, the large channel current flows in the writing operation, however, the source region 8 is formed deeper in diffusion with a higher dose quantity than the drain region 9, and comes to have a low resistance. Accordingly, a substrate bias effect based on the source resistance is restrained small, and this also contributes to enhancing the implantation efficiency.

Furthermore, in this embodiment, the overlap of the source region 8 with the floating gate 4 is restrained down to the minimum within such a range as to cause no offset. The erasing operation, however, makes the use of not the release of the electrons to the source region 8 from the floating gate 4 but the release of the electrons over the entire surface of the channel region, and hence the erasure efficiency becomes sufficiently high.

Moreover, though the drain region 9 is overlapped with the floating gate 4, this overlap is controlled by the ion-implantation in self-alignment with the control gate and by the thermal treatment executed thereafter, and therefore does not become larger with a futility. The source region 8 is also provided in self-alignment with the control gate 6 and the side wall insulating layer 7 as well. It is therefore feasible to reduce the gate length L while ensuring the effective channel length Leff enough to restrain the short channel effect, and to attain further downsizing of the memory cell.

Figure 3:
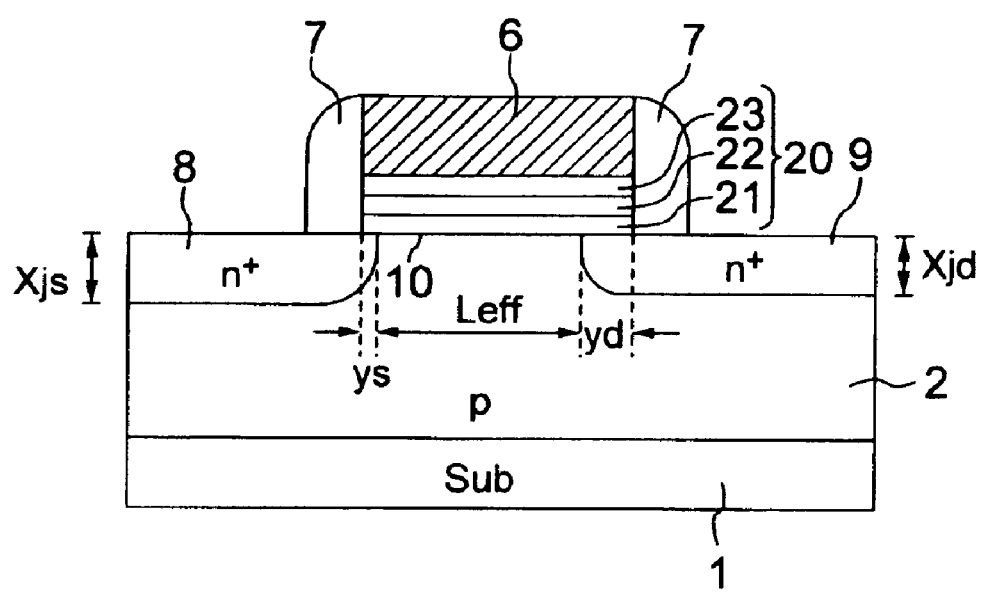
FIG. 3 is a sectional view showing a memory cell structure according to the second embodiment of the present invention.

FIG. 3 shows a structure of the non-volatile semiconductor memory cell, which is the second embodiment of the present invention. The components corresponding to those in FIG. 1 are marked with the same numerals as those in FIG. 1. A gate structure in this embodiment is different from that in the preceding embodiment, wherein neither the floating gate 4 nor the inter-layer insulating layer 5 is formed, and an insulating layer 20 under the control gate 6 takes a 3-layered structure consisting of a silicon oxide layer (a tunnel oxide layer) 21, a silicon nitride layer 22 and a silicon oxide layer 23. This functions as an electric charge accumulating portion in which the electrons are trapped by an interface level between the silicon oxide layer 21 and the silicon nitride layer 22 of the stack-structured insulating layer 20.

In this embodiment also, the following items (1)–(3) are the same as those in the preceding embodiment.

(1) The source region 8 is provided by the ion implantation in self-alignment with the control gate 6 and the side wall insulating layer 7, while the drain region 9 is provided by the ion implantation in self-alignment with the control gate 6.

(2) The overlap "ys" of the source region 8 with the electric charge accumulating portion (more specifically the overlap with the control gate 6) is small, while the overlap "yd" of the drain region 9 with the control gate 6 is larger than "ys".

(3) The dose quantity of the source region 8 is larger than in the drain region 9, and hence the diffusion depth "xjs" of the source region 8 is larger than the diffusion depth "xjd" of the drain region 9. The processes of forming a memory cell structure are the same as those in the preceding embodiment excluding the process of providing the gate area.

Figure 4A:
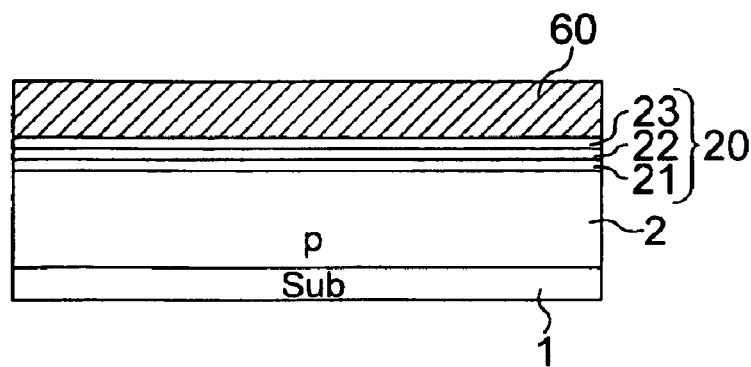
FIGS. 4A–4F are sectional views showing a process for obtaining the memory cell structure shown in FIG. 3.
Figure 4B:
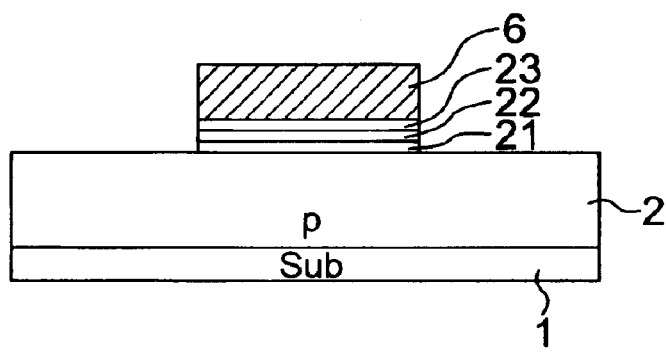
Figure 4C:
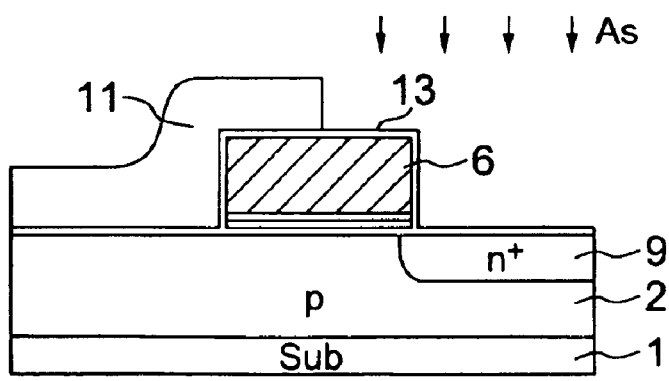
Figure 4D:
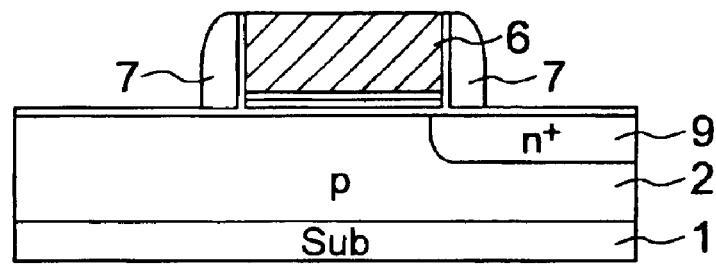
Figure 4E:
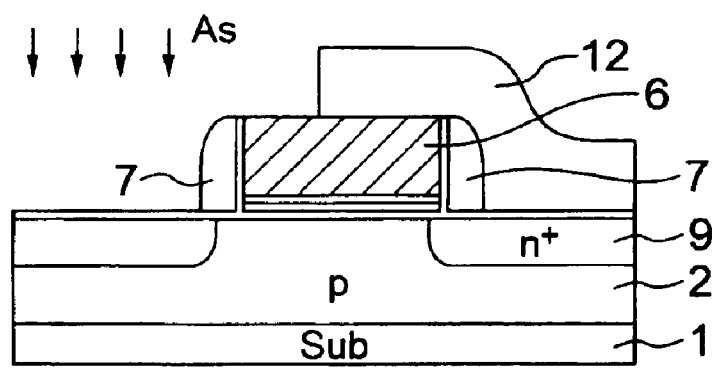
Figure 4F:
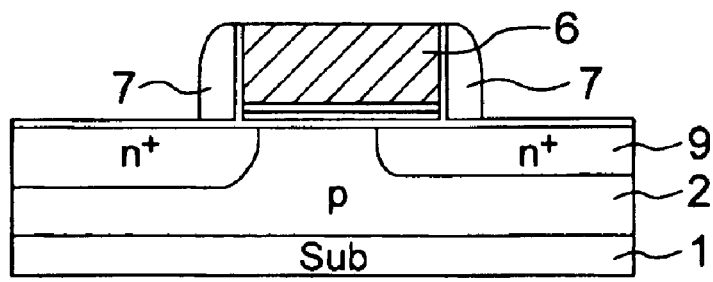

FIGS. 4A–4F are sectional views showing individual processes of obtaining the memory cell structure in FIG. 3, and correspond to FIGS. 2A–2F, wherein the corresponding components are marked with the same numerals. FIG. 4A shows a step of stacking the gate electrode area of the same memory cell, FIG. 4B shows a step of patterning the gate electrode area of the same memory cell, FIG. 4C shows a step of implanting the ions into the drain region of the same memory cell; FIG. 4D shows a step of providing the side wall insulating layer of the same memory cell, FIG. 4E shows a step of implanting the ions into the source region of the same memory cell, and FIG. 4F shows a step of the diffusion of the impurity of the same memory cell.

In this embodiment, the silicon oxide layer (the tunnel oxide layer) 21, the silicon nitride layer 22 and the silicon oxide layer 23 are stacked to form the 3-layered insulating layer 20 on the substrate, and a different point is that a polycrystalline silicon layer 60 for the control gate is stacked thereon. Other steps are the same as those in FIGS. 2A–2F.

In the memory cell in this embodiment, the writing operation is the same as in the preceding embodiment.

On the other hand, the erasing operation is that an electric field is applied to between, e.g., the drain region 9 and the control gate 6, and the electrons trapped by the interface level within the insulating layer 20 are pulled to the drain region 9. Alternatively, considering that the electrons can not easily be released only by the electric field, an electron accumulated state is neutralized by injecting holes. To be specific, the source region 8 is grounded, the control gate 6 is given a negative potential, and the drain region 9 is given a positive high potential, respectively. Band-to-band tunneling is thereby induced by the drain junction, and the generated holes are injected into the insulating layer 20. with this operation, the erasing efficiency becomes by far higher than in the case of releasing the electrons by the electric field.

This embodiment exhibits the same effects as those in the preceding embodiment.

Figure 5:
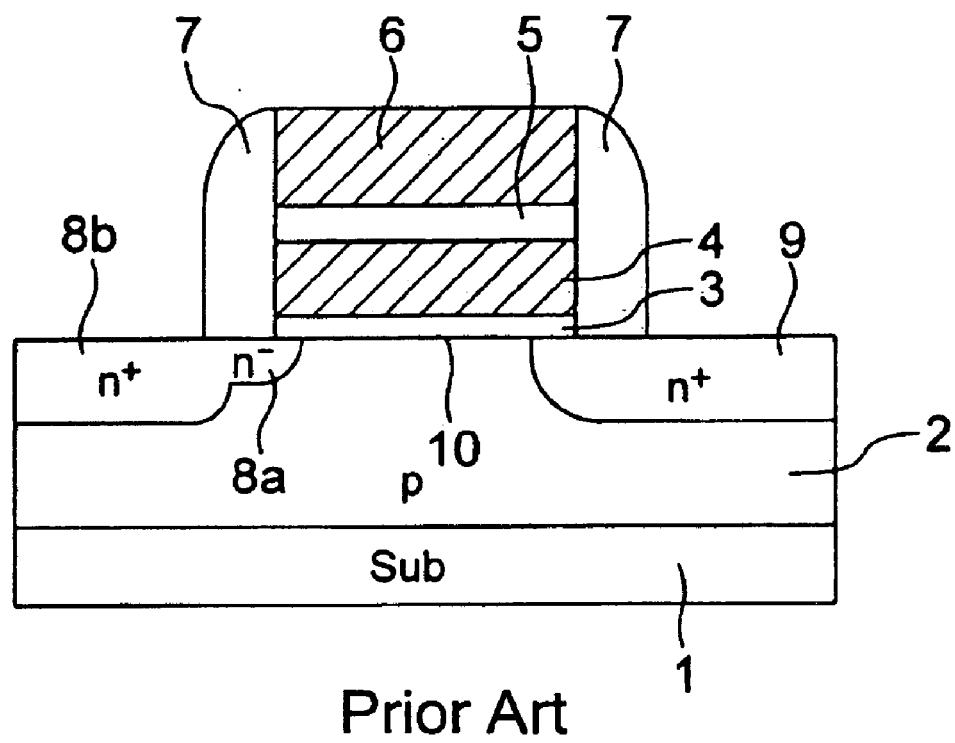
FIG. 5 is a view showing a memory cell structure for a comparison with the present invention.

Note that the overlap of the source region with the floating gate can be also set smaller than the overlap of the drain region with the floating gate by providing only the source region with the typical LDD structure. FIG. 5 shows a memory cell structure for a comparison with the present invention, in which the source side takes the LDD structure. In the memory cell structure illustrated in FIG. 5, the source region 8 is constructed of a shallow $n^-$ type diffused layer $8a$ having a low concentration, and a deep $n^+$ type diffused layer $8b$ having a high concentration. The $n^-$ type diffused layer $8a$ is provided by the ion implantation in self-alignment with the control gate 6, and the n+ type diffused layer $8b$ is provided by the ion implantation in self-alignment with the control gate and the side wall insulating layer 7. The drain region 9 is provided by the ion implantation in self-alignment with the control gate 6 as in the embodiment shown in FIG. 1. In the case of this memory cell structure, however, it is required in terms of obtaining an LDD characteristic that the overlap of the source region 8 with the floating gate 4 be taken over to the n⁻ type diffused layer 8a, and there arises a problem that a rise in the source resistance is inevitable.

Furthermore, according to a third embodiment of the present invention, there is also a method by which the drain region is provided by the ion implantation in self-alignment with the side wall insulating layer thicker than the source region. More specifically, if the overlap of the drain region with the floating gate becomes larger than needed due to the thermal process after the ion implantation, the overlap of the drain region with the floating gate is downsized to the minimum required by implanting the ions into the drain region outwardly of the side wall insulating layer. On the other hand, if the ions are implanted on the side of the source region by use of the same side wall insulating layer, the overlap of the source region with the floating gate becomes larger than needed. Such being the case, another side wall insulating layer is further provided on the side of the source region, and the region is formed by implanting the ions outwardly of this side all.

Figure 6A:
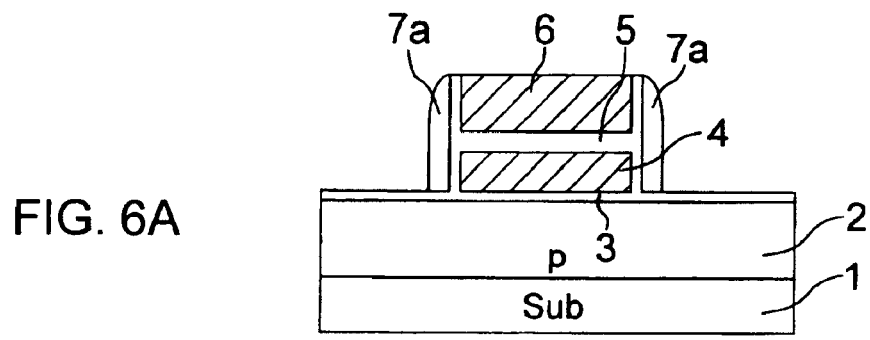
FIGS. 6A–6D are sectional views showing a process for obtaining a memory cell structure according to a third embodiment having double-layer side walls in the structure shown in FIG. 1.
Figure 6B:
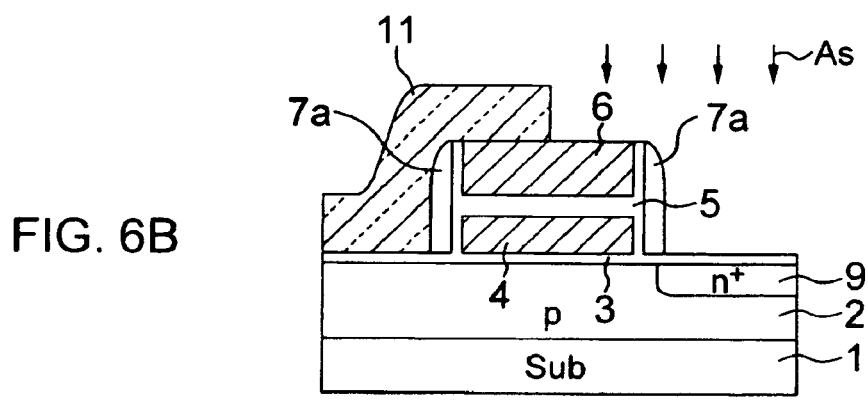
Figure 6C:
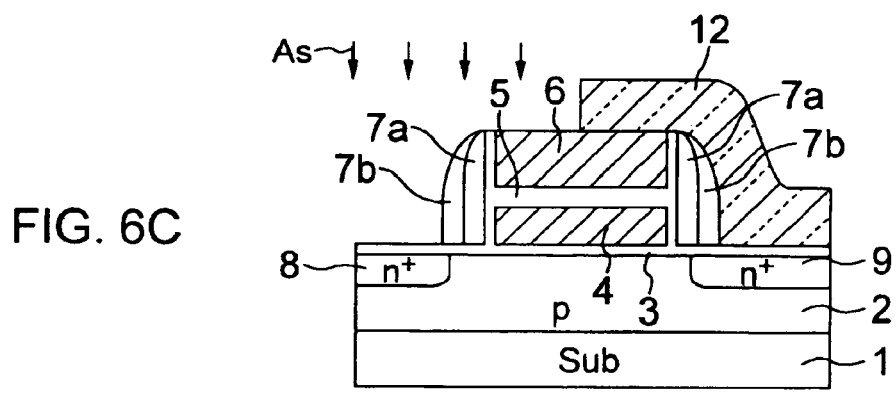
Figure 6D:
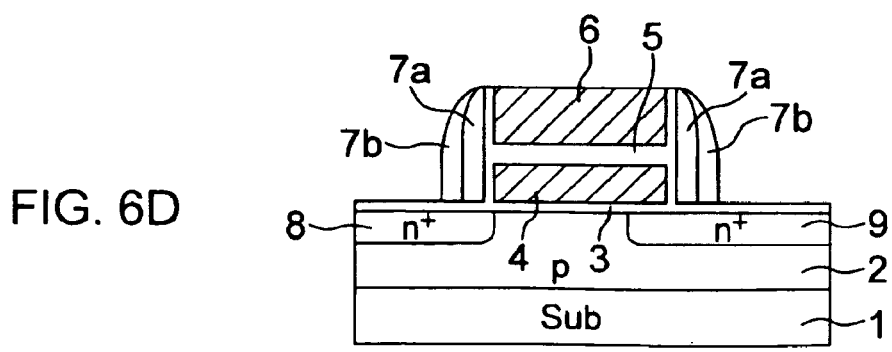

FIGS. 6A–6D show the manufacturing processes in the embodiment described above. FIG. 6A is a sectional view showing a process of providing a first side wall insulating layer, FIG. 6B is a sectional view showing a process of implanting the ions into the drain region in this embodiment, FIG. 6C is a sectional view showing a process of providing a second side wall insulating layer and a process of implanting the ions into the source region in this embodiment, and FIG. 6D is a sectional view sowing a process of the diffusion of the impurity in this embodiment.

After the process in FIG. 2B, as shown in FIG. 6A, a first side wall insulating layer 7a is provided on the side surfaces of the control gate 6 and of the floating gate 4. Then, as shown in FIG. 6B, a resist pattern 1 covering an area on the side of the source region is formed, and the drain region 9 is provided by implanting the ions, i.e., arsenic.

Subsequently, as shown in FIG. 6C, a second side wall insulating layer 7b is further provided on the outside of the first side wall insulating layer 7a. Then, a resist pattern 12 covering an area on the side of the drain region is formed, and the source region 8 is provided by implanting the ions, i.e., arsenic. Finally, the impurities of the source and drain regions 8, 9 are re-diffused, and the thermal treatment for activating the impurities is performed. The source region 8 is thereby, as shown in FIG. 6D, slightly overlapped with the floating gate 4, and there is obtained a state where the drain region 9 is largely overlapped with the floating gate.

Figure 7A:
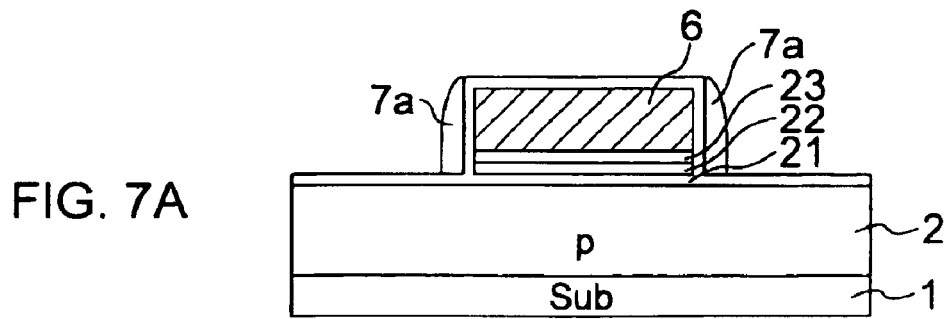
FIGS. 7A-7D are sectional views showing a process for obtaining a memory cell structure according to a fourth embodiment having double-layer side walls in the structure shown in FIG. 3.
Figure 7B:
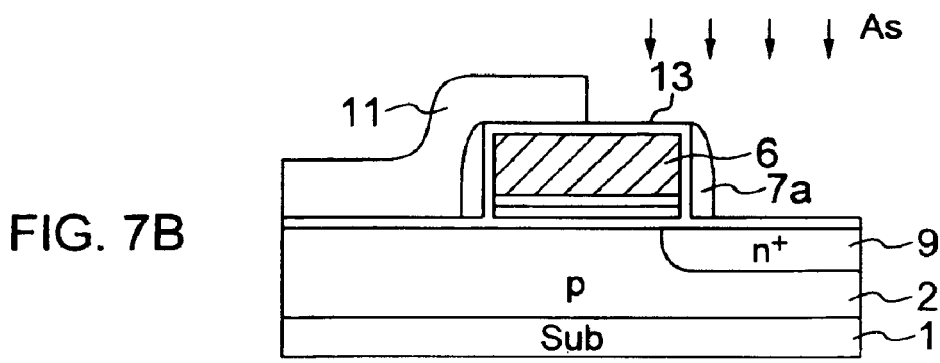
Figure 7C:
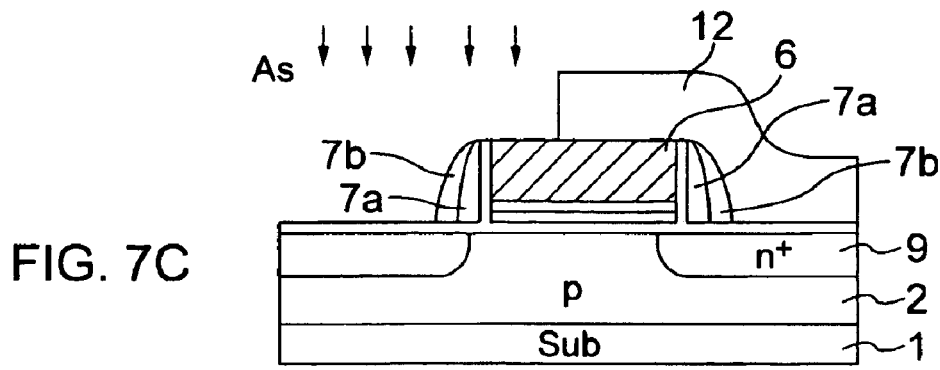
Figure 7D:
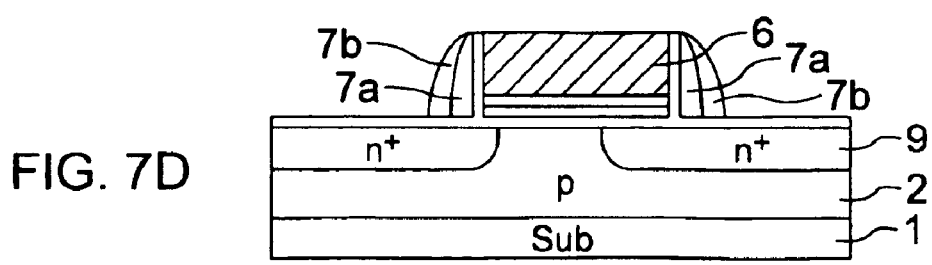

FIGS. 7A–7D show the manufacturing processes in the embodiment described above. FIG. 7A is a sectional view showing a process of providing a first side wall insulating layer, FIG. 7B is a sectional view showing a process of implanting the ions into the drain region in this embodiment, FIG. 7C is a view showing a process of providing a second side wall insulating layer and a process of implanting the ions into the source region in this embodiment, and FIG. 7D is a view sowing a process of the diffusion of the impurity in this embodiment.

After the process in FIG. 4B, as shown in FIG. 7A, a first side wall insulating layer 7a is provided on the side surfaces of the control gate 6 and of the floating gate 4. Then, as shown in FIG. 7B, a resist pattern 1 covering an area on the side of the source region is formed, and the drain region 9 is provided by implanting the ions, i.e., arsenic.

Subsequently, as shown in FIG. 7C, a second side wall insulating layer 7b is further provided on the outside of the first side wall insulating layer 7a. Then, a resist pattern 12 covering an area on the side of the drain region is formed, and the source region 8 is provided by implanting the ions, i.e., arsenic. Finally, the impurities of the source and drain regions 8, 9 are re-diffused, and the thermal treatment for activating the impurities is performed. The source region 8 is thereby, as shown in FIG. 7D, slightly overlapped with the floating gate 4, and there is obtained a state where the drain region 9 is largely overlapped with the floating gate.

Note that in the second through fourth embodiments, the impurity dose quantity of the source region 8 is set preferably larger than that of the drain region 9. The junction depth of the source region 8 is thereby larger than that of the drain region 9. These embodiments also exhibit the same effect as that in the preceding embodiment.

As discussed above, according to the present invention, it is feasible to obtain the hot electron injection type non-volatile semiconductor memory having the memory cell structure capable of reducing the gate length to the greatest possible degree while ensuring the effective channel length required.

What is claimed is:

1. A non-volatile semiconductor memory comprising:
    a semiconductor substrate;
    a source region provided in said semiconductor substrate;
    a drain region provided in said semiconductor substrate, said source and drain regions being spaced away from each other with a channel region disposed therebetween;
    a floating gate provided above said channel region; and
    a control gate provided above said channel region;
    wherein a writing operation is executed in such a way that hot electrons are generated in the vicinity of said drain region and injected into said floating gate, and an erasing operation is performed by releasing the electrons held by said floating gate into said channel region;
    wherein an overlap of said drain region with said floating gate is larger than an overlap of said source region with said floating gate;
    wherein said floating gate is provided between said channel region and said control gate through respective insulating layers; and
    wherein a junction depth of said source region is larger than a junction depth of said drain region.

2. The non-volatile semiconductor memory according to claim 1, wherein at least said source region has an end having a predetermined positional relation with an end of a side wall provided on a side surface of said control gate.

3. The non-volatile semiconductor memory according to claim 2, wherein said side wall comprises a first side wall and a second side wall formed on the first side wall, and wherein an end of said drain region and an end of said first sidewall, and an end of said source region and an end of said second side wall are in predetermined positional relations.

4. The non-volatile semiconductor memory according to claim 3, wherein said drain region is substantially aligned with said first sidewall and said source region is substantially aligned with said second side wall.

5. The non-volatile semiconductor memory according to claim 1, wherein said erasing operation releases electrons over a width of said channel region between said source and drain regions.

6. The non-volatile semiconductor memory according to claim 1, wherein said erasing operation releases electrons to said channel region regardless of position with respect to said source and drain regions.

7. The non-volatile semiconductor memory according to claim 1, wherein said source region is formed self-aligned to a side wall provided on a side surface of said control gate.

8. The non-volatile semiconductor memory according to claim 7, wherein said side wall comprises a first side wall and a second side wall formed on the first side wall.

9. The non-volatile semiconductor memory according to claim 1, further comprising circuitry to set a control gate potential to a relatively low potential compared to a channel potential and to set said channel potential to a relatively high, positive potential compared to said control gate potential, thereby conducting said erasing operation.

10. The non-volatile semiconductor memory according to claim 9, wherein the channel potential is provided through a contact to a p-well.

11. A non-volatile semiconductor memory comprising:
a semiconductor substrate;
a source region provided in said semiconductor substrate; and
a drain region provided in said semiconductor substrate, said source and drain regions being spaced away from each other with a channel region disposed therebetween;
a control gate provided above said channel region; and
an electric charge accumulation portion that is an insulating layer having a trap level therein, said insulating layer being provided between said channel region and control gate;
wherein a writing operation is executed in such a way that hot electrons are generated in the vicinity of said drain region and injected into said electric charge accumulation portion and an erasing operation involves neutralization of the electrons held by the trap level by injecting holes generated in the vicinity of said drain region;
wherein an overlap of said drain region with said electric charge accumulating portion is set larger than an overlap of said source region with said electric charge accumulating portion; and
wherein a junction depth of said source region is larger than a junction depth of said drain region.

12. The non-volatile semiconductor memory according to claim 11, wherein at least said source region has an end having a predetermined positional relation with an end of a side wall provided on a side surface of said control gate.

13. The non-volatile semiconductor according to claim 12, wherein said side wall comprises a first side wall and a second side wall formed on the first side wall, and wherein and end of said drain region and an end of said first sidewall and an end of said source region and an end of said second side wall have predetermined positional relations.

14. The non-volatile semiconductor memory according to claim 13, wherein said drain region is substantially aligned with said first sidewall and said source region is substantially aligned with said second side wall.

15. The non-volatile semiconductor memory according to claim 11, wherein said erasing operation releases electrons over an entire surface of said channel region.

16. The non-volatile semiconductor memory according to claim 11, wherein said source region is formed self-aligned to a side wall provided on a side surface of said control gate.

17. The non-volatile semiconductor memory according to claim 11, further comprising circuitry to accomplish said erase operation by increasing a drain region potential with respect to a source region potential and by decreasing a control gate potential with respect to said source region potential.

* * * * *

UNITED STATES PATENT AND TRADEMARK OFFICE
CERTIFICATE OF CORRECTION

PATENT NO. : 6,963,102 B2
DATED : November 8, 2005
INVENTOR(S) : Seiichi Mori

It is certified that error appears in the above-identified patent and that said Letters Patent is hereby corrected as shown below:

<u>Title page,</u>
Item [73], Assignee, change "Kabushiki Karsha Toshiba" to -- Kabushiki Kaisha Toshiba --.

Signed and Sealed this

Twenty-first Day of March, 2006

JON W. DUDAS
*Director of the United States Patent and Trademark Office*